United States Patent [19]
Davies et al.

[11] Patent Number: 4,736,274
[45] Date of Patent: Apr. 5, 1988

[54] AIR SEAL RETENTION MEANS

[75] Inventors: Michael L. Davies, American Fork; Lawrence Weber, Centerville, both of Utah

[73] Assignee: Unisys Corp., Detroit, Mich.

[21] Appl. No.: 944,133

[22] Filed: Dec. 22, 1986

[51] Int. Cl.$^4$ ............................................. H05K 7/20
[52] U.S. Cl. .................................... 361/399; 165/72; 165/80.3; 211/41; 361/384; 361/415
[58] Field of Search ................... 165/80.3, 72; 211/41; 361/383, 384, 399, 415; 277/12, 88

[56] References Cited

U.S. PATENT DOCUMENTS

| | | | |
|---|---|---|---|
| 3,719,860 | 3/1973 | Lawrence | 361/382 |
| 3,899,721 | 8/1975 | Borchard et al. | 361/415 |
| 4,277,815 | 7/1981 | Skroupa | 361/383 |
| 4,375,290 | 3/1983 | Zucchi et al. | 361/415 X |
| 4,441,140 | 4/1984 | Richard | 361/399 X |
| 4,503,484 | 3/1985 | Moxin | 361/383 X |
| 4,517,625 | 5/1985 | Frink et al. | 361/415 X |
| 4,549,602 | 10/1985 | Espinoza | 361/383 X |
| 4,550,836 | 11/1985 | Ellis | 211/41 |
| 4,572,515 | 2/1986 | Grazioli | 277/12 |
| 4,582,130 | 4/1986 | Modschiedler | 361/384 X |
| 4,646,202 | 2/1987 | Hook et al. | 165/80.3 X |
| 4,687,127 | 8/1987 | Pardo et al. | 361/383 X |

OTHER PUBLICATIONS

Irwin Schuster, 8 more printed-circuit, Product Engineering, Jun. 10, 1963, pp. 96 & 97.

Primary Examiner—R. R. Kucia
Attorney, Agent, or Firm—John J. McCormack; Nathan Cass; Kevin R. Peterson

[57] ABSTRACT

Disclosed are air seals adapted to be so engaged in a receiving card rack slot as to thrust out against the opposed slot bases and thus establish "base-engaging" retention forces, this effected in some embodiments by forming a base-engaging flexure strip along each tongue of the seal to that, despite dimensional and other variations, each flexure strip will be thrust-away somewhat from its slot-forming channel, when the seal is firmly seated in a slot.

28 Claims, 12 Drawing Sheets

AIR SEAL RETENTION MEANS

The following relates to systems and mechanisms for maintaining coolant-gas pressure in a closure. More particularly it relates to such systems and mechanisms as adapted for replacing a printed circuit board in a card rack.

BACKGROUND, FEATURES

Figure 1A:
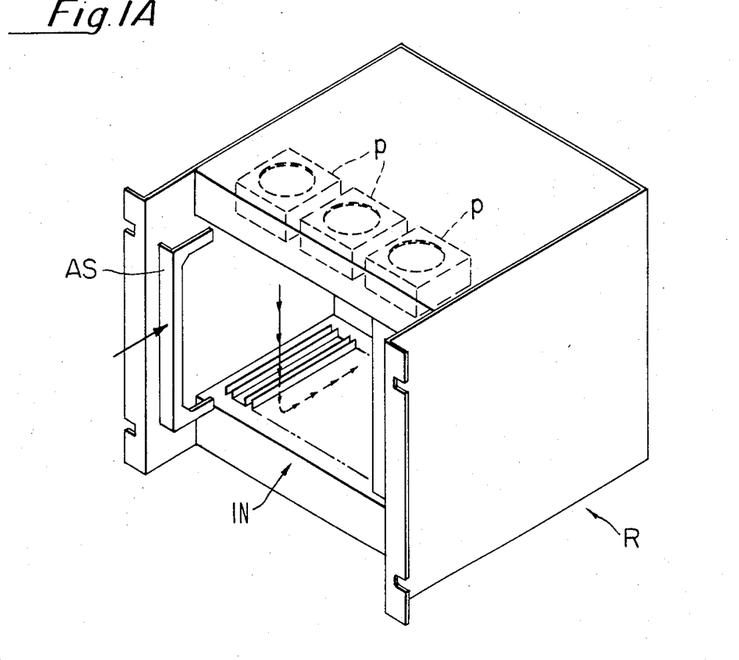
FIG. 1A is a fragmentary perspective of one such rack.
Figure 1B:
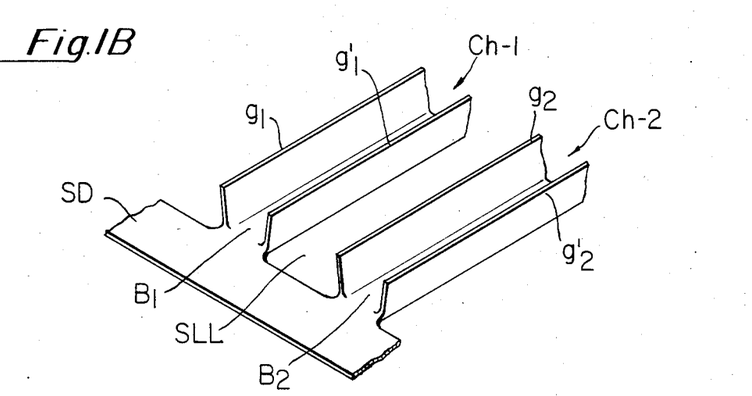
FIGS. 1B, 1C an enlarged partial perspective and side view of guides therein.
Figure 1C:
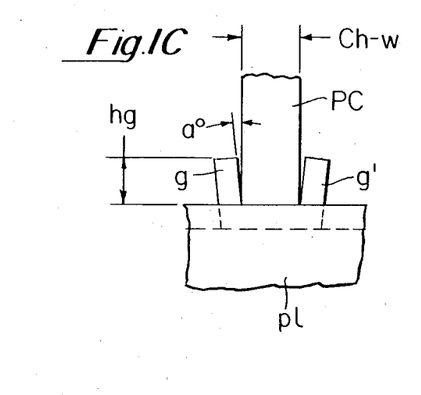
Figure 1D:
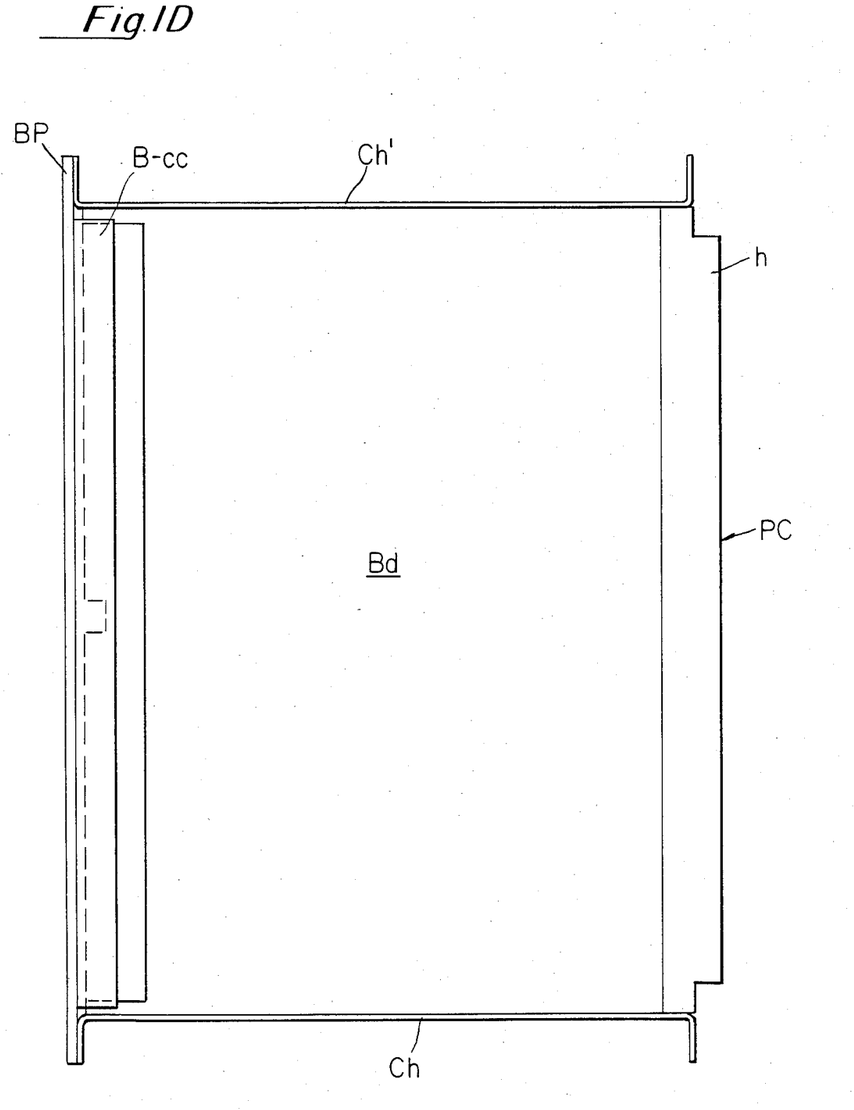
FIG. 1D a side elevation of a printed circuit board therefor.
Figure 1E:
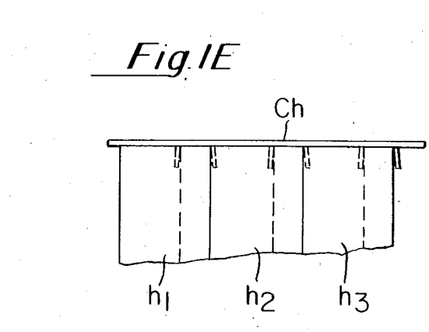
FIG. 1E a very schematic fragmentary front view of a set of three such boards inserted into a rack.
Figure 2:
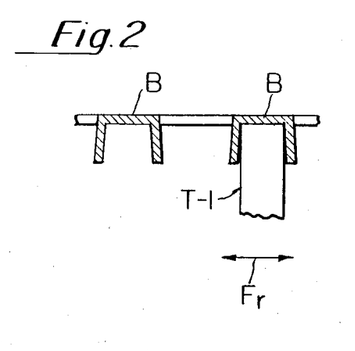
FIG. 2 is a highly schematic fragmentary section of such guides with a first "sinous" air seal means, shown in elevation in FIGS. 3, 3A in end-profile in FIG. 3B, in enlarged se in FIG. 3C and seated between guides in FIG. 3D.

Workers in the art of designing and using computer modules and like arrangements are aware that often a plurality of printed circuit cards must be mounted, side-by-side, in a card rack such as rack R in FIG. 2, and cooled there. FIG. 1 shows, in very schematic fragmentary side-view, a computer unit 1, characterized by three card racks R-1, R-2, R-3 each including upper input-plenum means (respectively $P_1$, $P_2$, $P_3$) adapted to receive input coolant air, e.g., pumped-in from outer inlet (cf. "AIR IN"), urge it down through its set of printed circuit cards (arrows, FIG. 1) to exit the rack and the machine (cf. "AIR OUT").

FIG. 1A shows, in schematic fragmentary perspective, one of the card racks R with three plenum means P (arrows show coolant path), it being understood that an array of printed circuit cards (e.g., as card pc in FIG. 1D) are to be stacked in parallel alignment, each engaged between respective upper and lower channels ch. Two exemplary lower channels ch-1, ch-2 are depicted in part in FIG. 1B, each comprising a spaced pair of guides or walls ($g_1$, $g_1'$ and $g_2$, $g_2'$) joined by an intermediate base ($B_1$, $B_2$ joined by side segment SD, FIG. 1B). For instance, guides g may be formed by cutting and bending a single sheet metal piece (SD, FIG. 1B) so that, for instance, $g_1'$, $g_2$ are cut and bent-up out of a slot SLL (FIG. 1B) through which the coolant air is to pass (as known in the art). Thus, the bases (e.g., $B_1$, $B_2$) and connecting side segments SD extend along a relatively flat common plane (pl, FIG. 1C) out of which the like guides g are raised. For various reasons, the guides are formed to diverge slightly in the "up-direction", e.g., in FIG. 1C, guides g, g', of height hg diverge a few degrees, being spaced about 100–120 mils apart at their base (plane pl, base-width ch-w). So, a pc board wedged-in between guides g, g' is apt to engage them for only a portion of their height hg (as with PC, cf. width ch-w, in FIG. 1B—here assume a like upper channel ch').

FIG. 1D shows, in schematic perspective, a typical printed circuit card PC, comprising a circuit-board Bd with connector pins cc at one end and enlarged head or handle means h at the other. The head will span its respective channel slot when fully-inserted in a slot, and so block egress of coolant-air from within rack R. Each of the relatively planar circuit boards PC is inserted from one side of the rack (note "IN" side of R) in respective "slots" defined between receiving upper and lower channel means Ch, Ch', being thrust between the channel guides g, g' defining each channel (e.g., see PC in FIG. 1C) snugly to be relatively firmly secured at the opposite (back) end of the rack where they are typically lodged in a connector pin array, etc. (cf. FIG. 1D, pc connectors cc engaged by back panel connector B-cc and held in channels ch, ch'). FIG. 1B schematically illustrates (fragmentarily) a part of a typical channel Ch defined between a pair of like spaced guides g, g', projected from a common base plane pl to be projected a prescribed height hg thereabove.

As workers know, heat dissipation from such a closely-packed array of boards (PC) can be a problem unless supplemental cooling means is supplied, such as forced air, or a like gaseous draft, as indicated by the arrows in FIGS. 1, 1A—the coolant gas being entrained, for instance, down along both sides of all the cards (from top to bottom, here). Typically, rack R will be enclosed within some cabinet means, such as a computer chassis (as FIG. 1) wherein the entrained air may be kept at a positive pressure (above ambient; e.g., with an intake and fan means above each rack, as workers in the art appreciate). A typical card PC is shown in FIG. 1D and discussed above.

It will be apparent that, unless all the "slots" in a rack are filled with cards, and the cards thrust-in fully to block egress of coolant-air, such air will escape. Thus, if heads h of a PC array filling all slots in rack R (FIG. 1A) are disposed in contiguous abutment across the entry plane "IN" of rack R, the pressurized coolant air within is kept from escaping—otherwise an air-leak may radically degrade, if not destroy, the inner overpressure and interfere with necessary cooling. (For instance, see adjacent heads $h_1$, $h_2$, $h_3$ in FIG. 1E and discussion thereof below).

Thus, when any given card PC is withdrawn from a full set in rack R, the body of pressurized air should still be kept up to pressure within the rack by substitution of what workers call an "air seal" (e.g., see AS in FIG. 1A). An "air seal" typically comprises a replica of enlarged head means h along with associated attachment means for gripping the guides g, g' of both channels Ch. As workers well know, it is problematic to manufacture such "air seals" inexpensively and efficiently and so they exhibit precise dimensional and shape tolerances; e.g., so they are configured with sufficient precision to assure insertion and retention in any slot, willy-nilly, without some "play" that allows pressurized air to escape. This invention is directed toward improved "air seals".

This problem is exacerbated, of course, by attempts to standardize the design and manufacture of a card rack R from sheet metal stock (cf. using inexpensive material and methods, e.g., to form the channel pairs ch, ch'). For instance, the guides g, g' making up each channel can obviously vary in size, shape, spacing, etc.—though each channel must snugly receive any card and its associated head, as well as any and all "air seals", however fabricated.

This problem is even further aggravated when the channel guides g, g' are made relatively shallow (cf. reduced height hg thereof, FIG. 1C).

This invention is intended to develop methods and means for addressing such problems and features, e.g., for improving such air seals so they are better adapted for such sheet metal card racks where the depth of the card guides is minimal, and to particular methods and arrangements for better retaining air seals in such guides.

This invention is further intended to provide improved means for retaining air seals in a sheet metal card rack adapted for a computer processor and/or an associated I/O chassis, particularly where the air seal includes molded plastic spring means thrust against the bases from which the card guides are projected, wherein such spring means are adapted to so engage such bases as to provide superior frictional retention of the air seal. This invention is thus adapted to provide a more positive, more reliable engagement and retention of air seals in shallow card guides. More particularly this invention is adapted to provide engagement-forces normal to such a guide-base, rather than relying only on lateral (side-to-side) forces, directed parallel to the plane of the guide-base.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements:

FIG. 1 very schematic fragmentary side view of a computer unit card racks apt for using the invention, while

The invention will be better appreciated by workers upon consideration of the following detailed description of some preferred embodiments.

DESCRIPTION OF PREFERRED EMBODIMENTS

General description, background

The following illustrates an air seal S-1 by way of example and background.

This, and other means discussed herein, will generally be understood as selected, formulated, and operating as presently known in the art, except where otherwise specified. And, except as otherwise specified, all materials, methods, and devices and apparatus herein will be understood as implemented by known best expedients according to present good practice.

PRELIMINARY CONSIDERATIONS (FIGS. 2, 3)

Preliminary consideration is given to a non-preferred "side-engaging" air seal S-1 shown in FIGS. 2, 3, 3A, 3B, 3C, 3D. Seal S-1 comprises a relatively conventional handle or head portion h (like the head of an ordinary pc board) with pull-slots ts, ts' for engagement of a well known puller-tool (to remove from rack). From the ends of the head h are orthogonally projected a pair of like tongue portions T-1, T-1' adapted to be thrust along respective upper and lower channels ch, ch' and configured to frictionally engage the sides (guides) of those channels, being given a sinuous or serpentine segment (cross-sectional configuration) adapted for "side-engagement" of the guides (portions to be thrust vs. opposing inner sides of guides). This serpentine configuration will be noted as adapted to engage the inner sides of the channel guides g, g' (rather than the base from which they are mounted), generating "sidewise" (or lateral) engagement forces (parallel to base B—note direction of engagement force arrow $F_r$ in FIG. 2).

Figure 3:
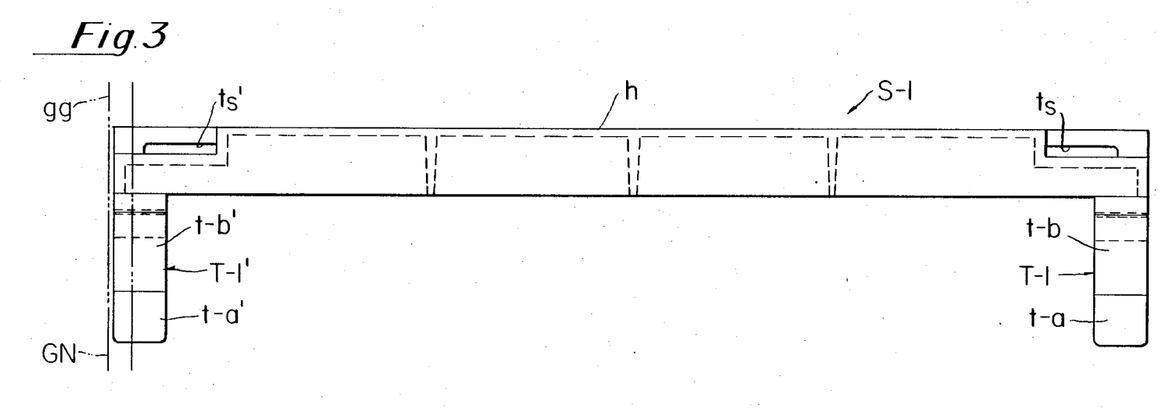
Figure 3A:
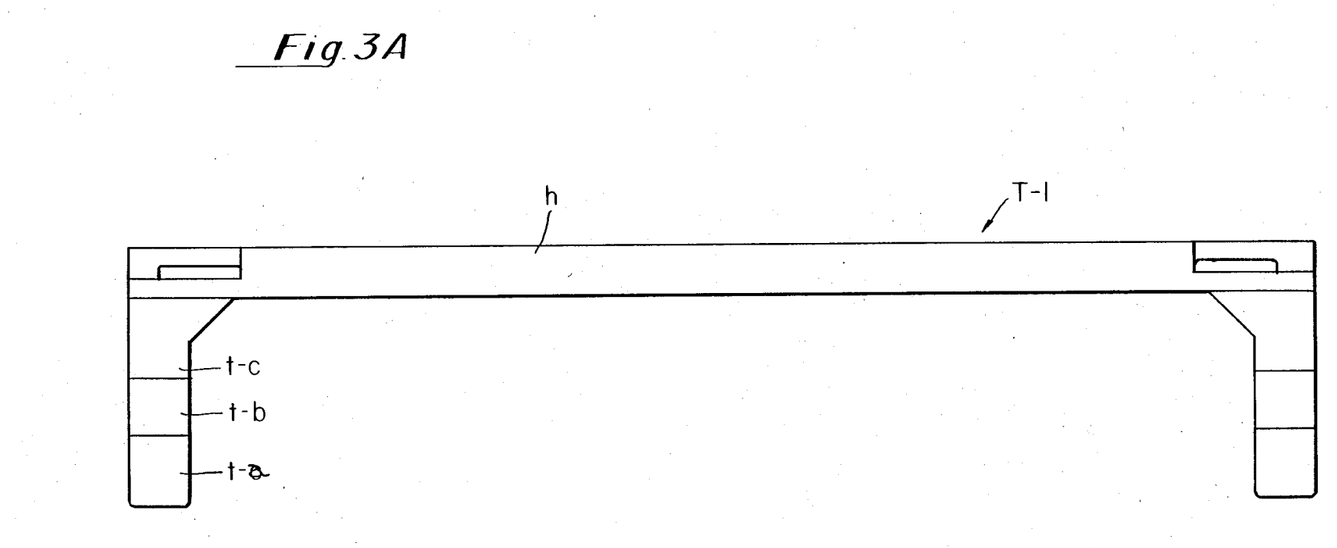
Figure 3B:
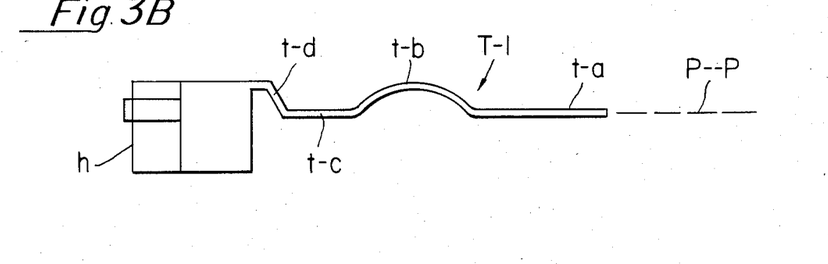
Figure 3C:
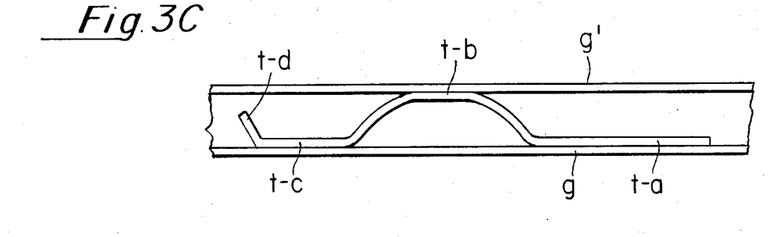
Figure 3D:
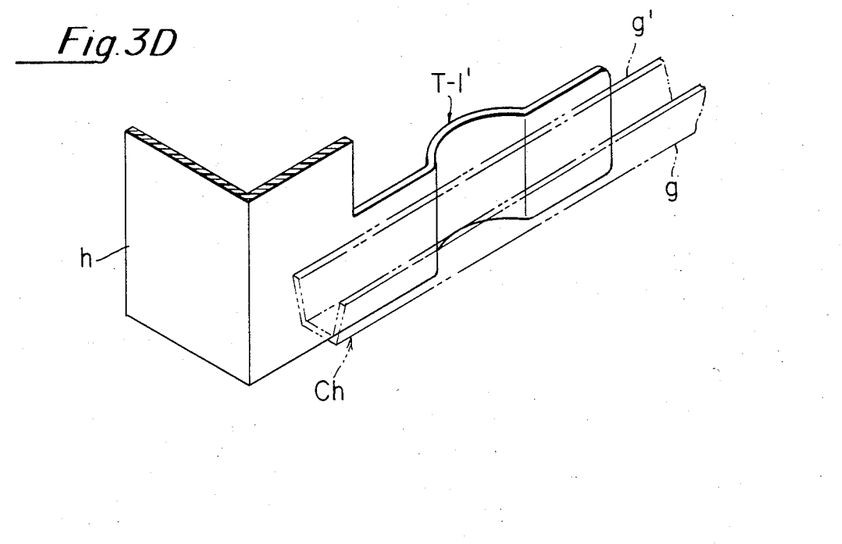

FIGS. 3B, 3C, enlarged end views of one of these tongues T-1, best suggest this sinuosity, showing the tongue extension t-d projected from head h and from which is projected an "offset" segment t-c projected along a prescribed reference plane P—P. A somewhat reentrant arcuate segment t-b is projected from segment t-c, extending at its maximum a prescribed channel-spanning distance dc away from plane P—P, sufficient to frictionally engage the opposing guide g' (and, preferably, be resiliently distorted thereby—this illustrated in exaggerated fashion in FIG. 3C). Arcuate segment t-b, in turn, projects another planar, terminal segment t-a coplanar with t-c along reference plane P—P. Workers will appreciate (for instance, from the exaggerated schematic views in FIGS. 2, 3C) how the coplanar segments t-c, t-a may be inserted to engage (be thrust against) the inside of one guide g, while the intermediate arcuate segment t-b is curved away therefrom sufficient to engage the opposite guide, and, ideally, be distorted somewhat by it, for a tight frictional "sidewise" engagement. Tongues T-1, T-1' of seal S-1 may be molded nylon or like suitable semi-rigid material as known in the art.

FIG. 1E may be taken to depict a fragmentary illustrative portion of the card rack R of FIG. 1A where, for instance, the heads $h_1$, $h_3$ of two printed circuit boards will be understood as inserted fully and engaged in their channels ch (see guides in phantom), while the intermediate channel is sealed by the head $h_2$ of some suitable "air seal" device. Here, it will be understood that, ideally, all heads h are abutted contiguously and fill the entry side "IN" of the rack R so that no pressurized coolant air can escape (through that "entry side").

PROBLEMS

Workers in this art will be rather familiar with the problem of making "side-gripping seals" (like S-1, discussed above) so they are sufficiently accurate in dimensions and configuration as to be reliably, positively and efficiently engaged in slot channels, with their head placed, and kept, firmly in position to prevent air leakage—particularly in view of the difficulty in making card rack structures which exhibit tight tolerances and sufficient rigidity to reliably receive and hold any air seal. And even when such a seal is positively, firmly engaged in its channel (which is not all the time), it is too commonly upset and released by ambient shock and vibration, or by the pressure of the coolant air within, etc., as workers well know.

And such common regrettable shortcomings are badly exacerbated when the channel guides (e.g., g, g') are foreshortened (that is, their height reduced, see FIGS. 1B, 3D), since it will be evident that a sinuous, "side-gripping" tongue design (like S-1 above) will generate engagement forces which are proportional to the guide-area contacted by the tongue. Thus, if guide height is radically reduced (for instance, as suggested in FIG. 3D where channel guides g, g' are shown in phantom extending from their base to reach only about half way up the width of tongue T-1')—the gripping forces are likewise radically reduced. The invention is directed toward alleviating such problems (e.g., in embodiments to follow).

PREFERRED SOLUTIONS

FIRST EMBODIMENT S-1: FIGS. 4, 5, 6, 7

Thus, workers in the art will readily concede that, in many instances, air seals with "side-gripping" tongues leave much to be desired; e.g., too often being not so positively and firmly retained in their card rack as to adequately maintain coolant over-pressure. Workers will certainly concede that this becomes an ever greater problem when the height of the channel guides is reduced. Thus, one salient feature of the present invention is to provide air seals with "base-engaging", rather than "side-engaging", tongues, as exemplified, for instance, in a preferred embodiment S-2 (see FIGS. 4, 4A, 4B, 5, 6 and 7) described as follows.

Figure 4:
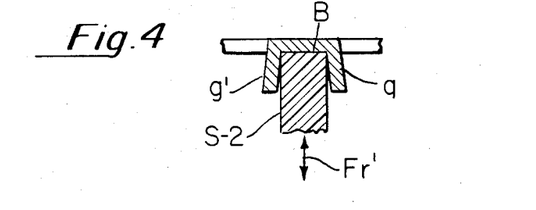
FIG. 4 is a view after FIG. 2 of an air seal according to a first embodiment, this being shown in elevation in FIGS. 4A, 4B and FIG. 6, and in plan view in FIG. 7 and in schematic side-view, as installed, in FIG. 5.
Figure 4A:
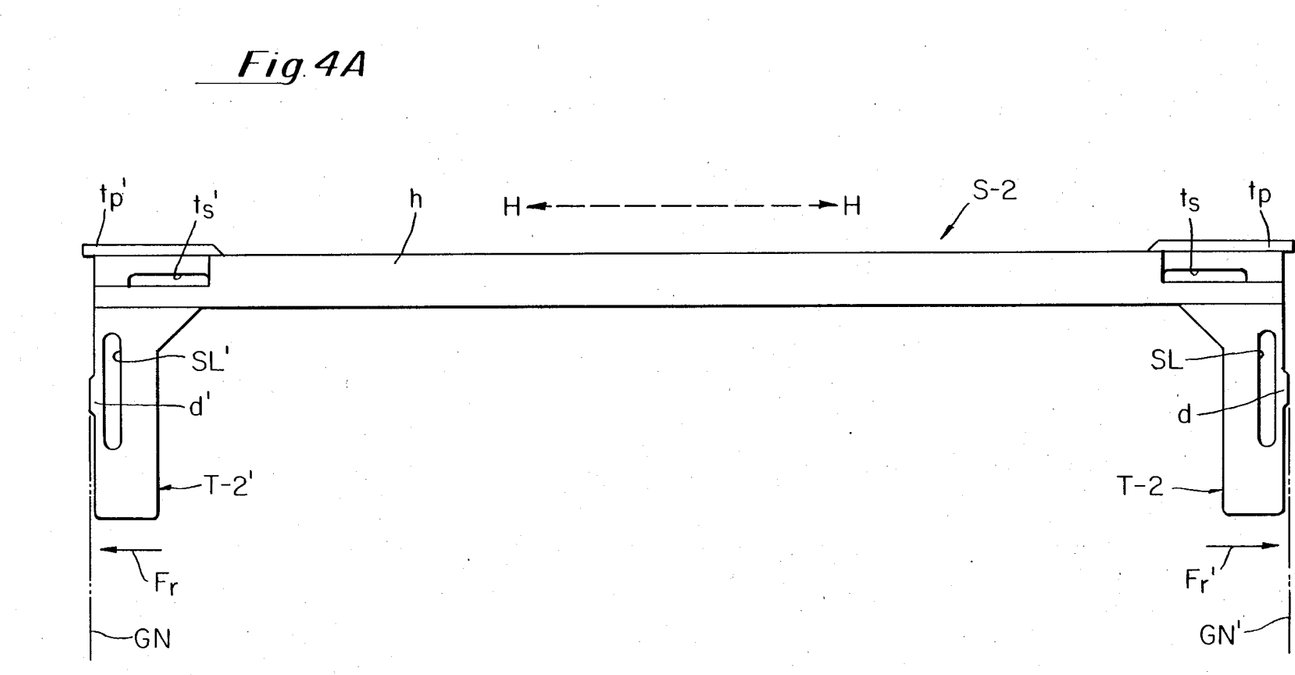
Figure 4B:
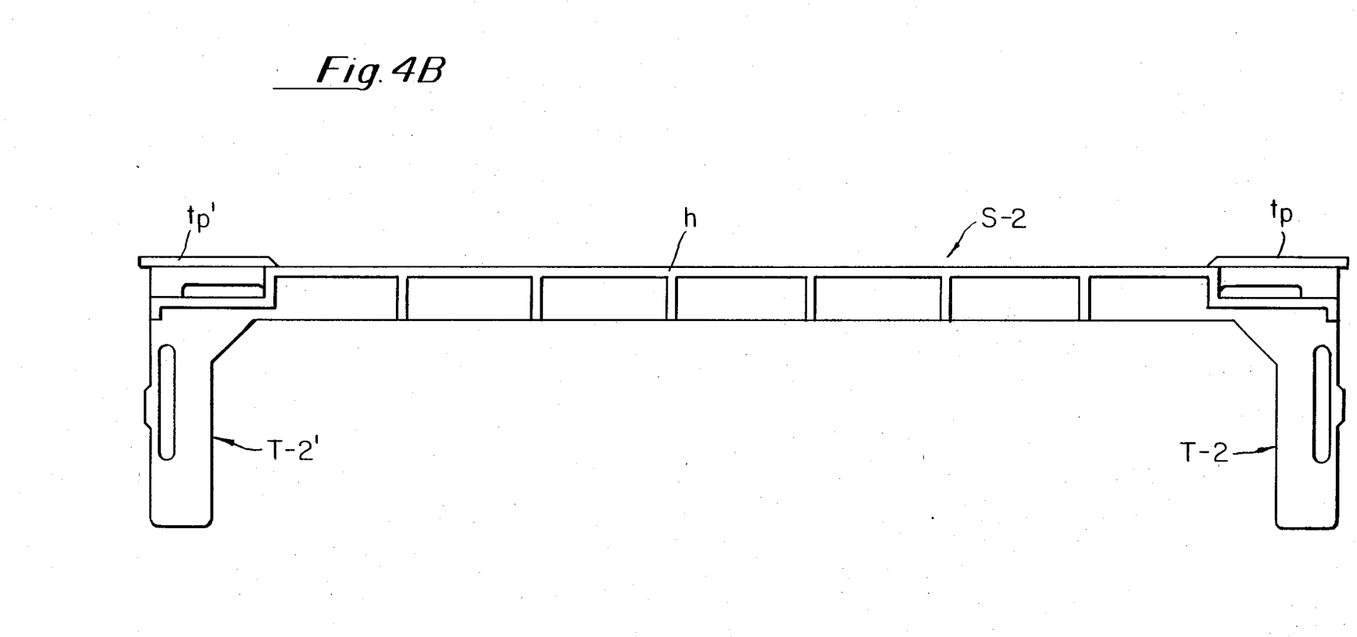
Figure 5:
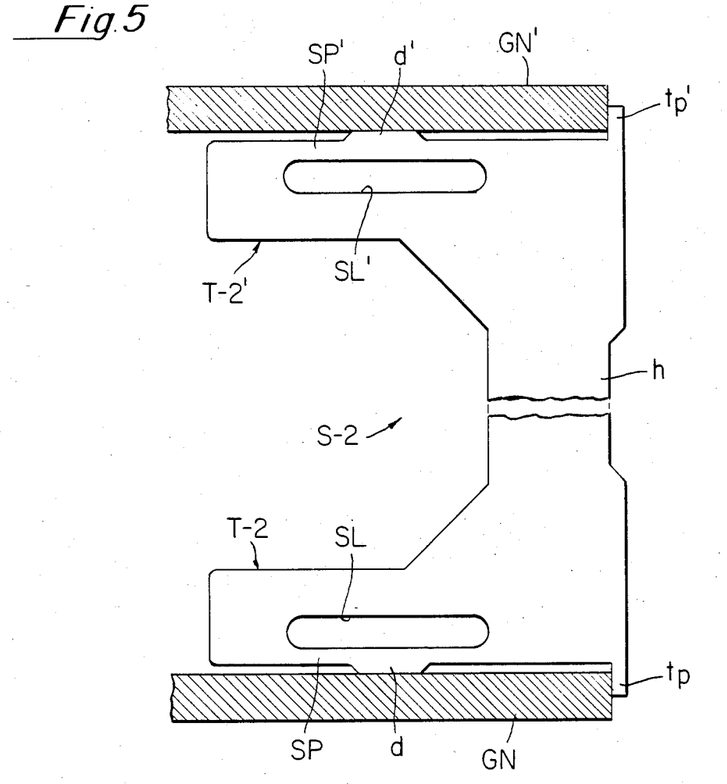
Figure 6:
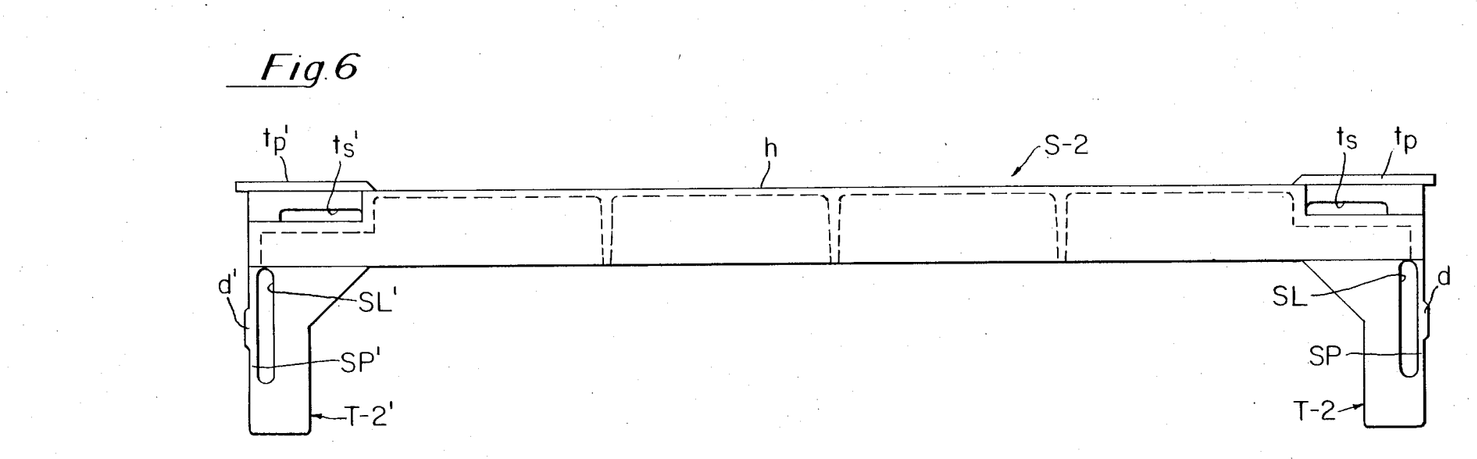
Figure 7:
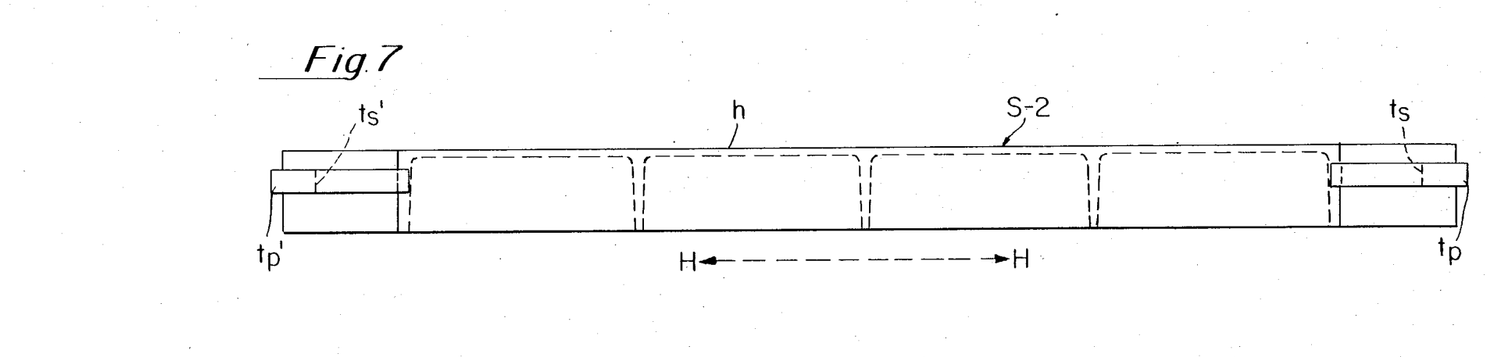

FIGS. 4, 4A and 4B show a modified improved "air seal" S-2 improved according to the subject invention to be "base-engaging" rather than "side-engaging" ("guide-engaging"). It may be compared, for instance, with a comparable view in FIG. 3 of "side-engaging" seal S-1. FIGS. 4A, 4B are xerox reproductions, to actual size, while FIG. 6 is a similar schematic line drawing, FIG. 7 is an associated plan view and FIG. 5 is a side view of improved seal S-2 as inserted in exemplary upper and lower channels of a card rack, with spring detent portions d, d' shown bearing against respective channel bases GN, GN'. (Compare base B in FIGS. 1B, 4, etc.).

It will be seen that embodiment seal S-2 is an example of a structure that is frictionally engaged by thrusting opposed tongue-spring means against the channel bases, this thrust directed elongately along its elongate axis (see elongate axis H—H of the head h of S-2 in FIGS. 4A and 7 and see arrow $F_r'$ in FIG. 4)—rather than thrusting laterally (from side to side) against the guide means (as for instance, with prior described seal S-1; see FIG. 2 for comparison).

Figure 5A:
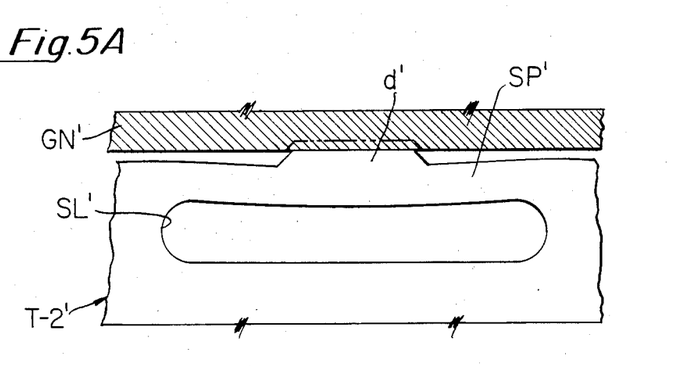

Seal S-2 may be looked upon as relatively conventional (e.g., in construction of head h, etc.) except as otherwise described; in particular except as regards the base-engaging structure of its tongues T-2, T-2'. Seal S-2 includes tool-puller slots ts, ts' and further includes a pair of projecting "stops" tp, tp' to limit the thrust into rack. Tongue structures T-2, T-2' (best seen schematized in the fragmentary schematic of FIG. 5) each comprise a relatively flat, thin planar body projecting orthogonal to head axis H—H (to extend along the elongate axis of the channels ch), having an inner portion thereof relieved to form an elongate slot (SL, SL') extending along a good part of the tongue length and adapted to form a thin, resilient outer "spring bar" portion (SP, SP') closing the slot. This spring bar is characterized by a relatively central detent or projection (d, d') adapted to bear against a respective base (GN, GN') of its intended channel when seal S-2 is inserted in its rack. Thus, for instance as seen in FIGS. 4A, 5A (note in FIG. 5A phantom location of unstressed detent d', and compare for instance FIG. 3 for seal S-1 above), when seal S-2 is inserted into channels (in slot between bases GN, GN') where the guides (gg in phantom) are relatively shallow, it will matter relatively little since the detents d, d' will project resilient engagement forces thrusting outwardly against bases GN, GN' (note arrows denoting retaining forces $F_r'$ FIG. 4A).

TYPICAL DIMENSIONS

Thus, for instance, for a seal S-2 about 10" long (nominal length Ln between outside of unstressed springs sp, sp', FIG. 5) by about 0.07" wide (width of head h, which is about ⅜" high), tongues T-1, T-2' may be about 1.75" long (extension away from head h) by about ¼" wide and about 3/32" thick, and present slots SL, SL' about 1" long by about ⅛" high, to form spring bars sp, sp' about 5 mils thick surmounted medially by respective detents d, d' projected about 35 mils therebeyond and having a base-engaging "flat" therealong about 0.2" long. More particularly, each detent is projected 0.035" beyond its spring bar (sp, sp'). Thus, the two detents add 70 mils to the nominal length Ln of seal S-2 [ignoring stops tp, tp' each projected well beyond Ln, sufficient to overlap the slot (on bases GN, GN', as depicted in FIG. 5, for instance; e.g., each tip may extend about 0.1" beyond the engagement plane of its nearby detent, or more if necessary]. These stops are shown as separate pieces but may be made integral with head h.

Thus, for instance, a seal S-2 can be mass-fabricated reliably and inexpensively with an overall engagement length Le (between detents d, d') of a nominal 10.070" plus/minus 0.005. This may be compared with known card racks where the receiving-slot nominal length Ls (reliably constructed in mass production techniques) is a nominal 10.015" plus/minus 0.015", varying Ls between 10.030 and 10.000". Thus, workers in the art can see how, even under worst case conditions, detents d, d' may still be positively engaged into a receiving slot, and be displaced enough to invoke reasonable slot-retaining forces, despite expected variations in the size, shape of the seal parts or of the rack. For instance, consider the following worst cases.

A. Worst case "shortest" seal S-2 (in longest slot):

Minimum effective seal length Le (between detents) is 10.065", vs. maximum slot length of 10.030" (i.e., the longest receiving slot). This means a difference of about 35 mils, or about 17.5 mils deflection per spring bar—something quite adequate to firmly seat seal S-2 and keep it so.

B. Worst case "longest" seal S-2 in "shortest" slot:

Maximum length seal is about 10.075" vs. minimum length slot of 10.000"; the difference would be about 75 mils, or about 37.5 mils deflection per spring bar—against not over-stressing it and quite adequate for good results and engagement.

Workers will appreciate how seal S-2 acts to invoke base-engagement rather than side-engagement; how it tolerates a good deal of variation in part dimensions and configuration, how it can isolate the design from concern over guide-height (less problem with "shallow guides") and, in general, provide an air seal exhibiting good engagement forces and good retention in a card rack.

EMBODIMENT S-3, FIG. 8

Figure 8:
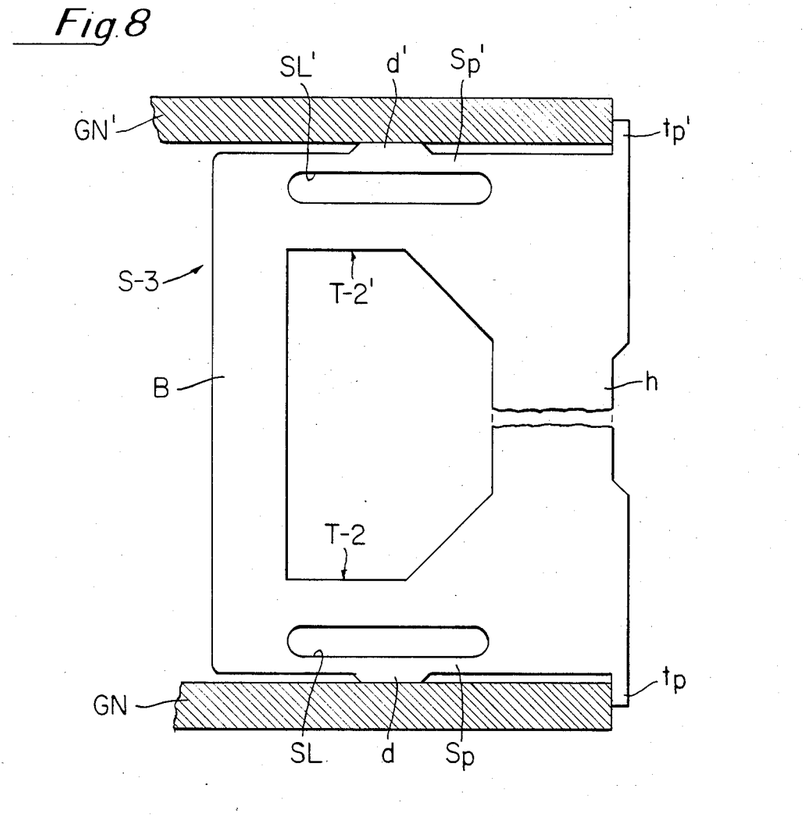
FIG. 8 shows a view like FIG. 5 of a second modified embodiment.

FIG. 8 shows a further modified, more-preferred embodiment S-3 which may, in general, be taken as the same as the above-described embodiment S-2 except as otherwise specified.

Base-engaging air seal S-2 is replicated here except that a relatively rigid brace segment B is provided between tongues T-2, T-2' to further rigidify them and help assure that essentially all (preferably 100%) of the seal-deflection between detents d, d' will be confined to spring bars sp, sp'—that is, so the body of tongues T-2, T-2' will be effectively prevented from deflecting or distorting under the insertion-retention forces between bases GN, GN' as described above. Without brace segment B, the tongues may tend to bow toward one another, and/or to be twisted, etc. under engagement forces as the seal is inserted into a rack slot.

EMBODIMENT S-4, FIG. 9

Figure 9:
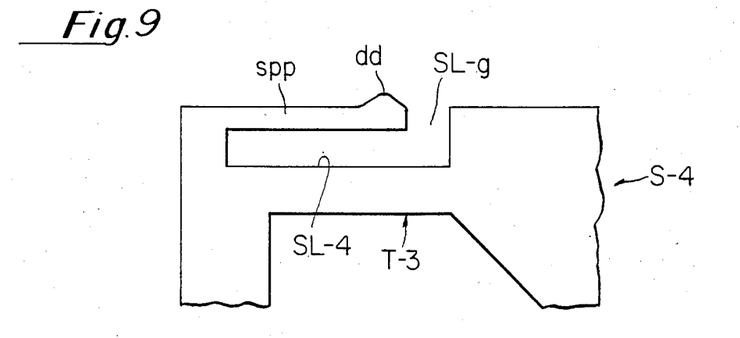
FIGS. 9, 10, 11A show enlarged very schematic fragments of a seal portion of third, fourth and fifth embodiments, with FIG. 11B showing the fifth embodiment stressed and installed.

Embodiment S-4, FIG. 9, is the same as S-3 except for being further modified by, in essence, varying the configuration of the slots in both tongues (see SL-4 in FIG. 8), opening each adjacent the proximal end of spring bar spp to form a slot-mouth SL-g. Thus, each spring bar spp becomes a re-entrantly cantilevered flexure spring (having a projecting detent protrusion dd adjacent the free end of bar spp; the other opposite tongue T-3' of seal S-4 is, of course, symmetrical and similar, though not shown here). Thus, insertion of base-engaging seal S-4 into a rack-slot (channels) will thrust respective detents dd, dd' (dd', spp', etc. not shown) against respective channel bases GN, GN', thus deflecting the end of the so-formed cantilevered spring bars (spp, spp', as in phantom in FIG. 9), to render the prescribed base-engagement.

Detent dd on the end of spring bar spp will be understood as preferably formed with a smooth gradual slope gradient on each side so that, as the seal is first thrust into its receiving channels, each base-engaging spring spp will slide smoothly along its receiving-base, with this base eventually bridging the slot-gap SL-g adjacent the end of spp, as workers in the art will understand.

This should give a desired gradually-increasing, resilient engagement force as the seal is inserted further and further. This design will minimize the chance that the free end of such a spring bar (spp) may be caught, bent or broken-away by rack parts or other external forces (e.g., vs. S-5 in FIG. 10). Similarly, as seal S-4 is withdrawn, the base-engaging forces will be gradually reduced, as desired. This is quite advantageous as those skilled in the art will see, especially as compared, for instance, with companion modified seal S-5 in FIG. 10 (described below).

Figure 10:
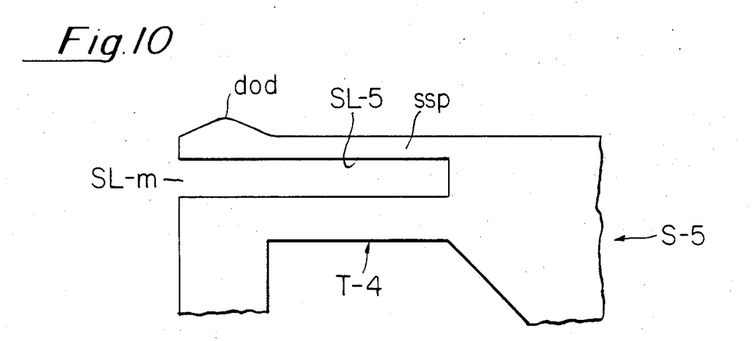

Here, as with the embodiment of FIGS. 8, 10 a rigidifying brace B preferably extends between tongues T-3, T-3' of S-4 for greater rigidity, of the main body of the tongues, allowing the spring bar spp to undergo substantially all of the distortion of engagement forces, with essentially no distortion of the rest of either tongue body.

EMBODIMENT S-5, FIG. 10

FIG. 10 shows a further modified embodiment seal S-5 understood as essentially the same as S-4 except that its spring strips ssp, ssp' face in the opposite direction relative to their tongues (and relative to insertion and withdrawal motion) and except for the fact that its slots SL-5, SL-5' are opened not upwardly toward the guide base as with SL-4, but outwardly along the direction of insertion (cf. mouth SL-m). As seal S-5 is inserted, initial engagement forces will be relatively high (vs. S-4). Also, base-engaging air seal S-5 presents greater risk of catching and breaking or distorting the free end of its springs ssp, ssp'. By comparison, it will usually be preferable to form the spring cantilever in the fashion of embodiment S-4 (FIG. 9) to experience a more gradual increase in engaging spring forces as the seal is inserted (and gradual decrease as it is withdrawn). Also, as mentioned there is less risk that bar spp will be caught and distorted or broken by the channel or other external forces in edges, etc.

EMBODIMENT S-6, FIGS. 11A, 11B

Figure 11A:
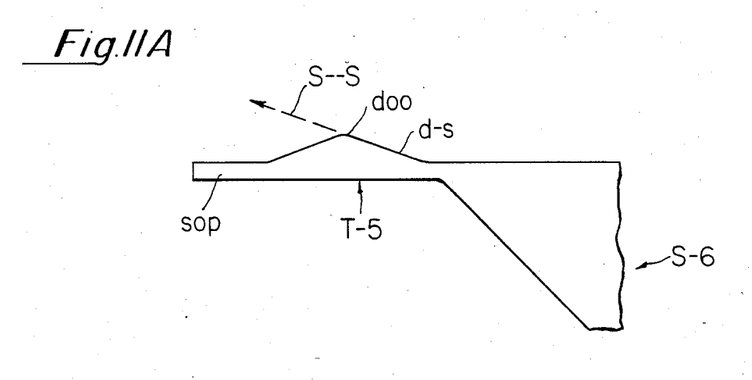

FIG. 11A presents a somewhat different "base-engaging" air seal S-6 where the body of its related tongues T-5, T-5' are sufficiently long, thin and resilient to, themselves, exhibit bending engagement flexibility, so that, when seal S-6 is inserted into respective channels, against the bases thereof (bases not shown), seal S-6 will stay firmly in place. (Tongue T-5 cooperates as like tongue T-5', not shown, as understood in the art). The tongues will be bent somewhat between channel bases GN, as indicated in exaggerated fashion in FIG. 11B. As before, each tongue presents an associated detent or projection doo projected outward for engagement with a base GN (doo' for GN'), these detents being sloped and disposed somewhat inward of the tongue end for purposes like those described with respect to S-4 in FIG. 9 (vs. FIG. 10) above.

Figure 11B:
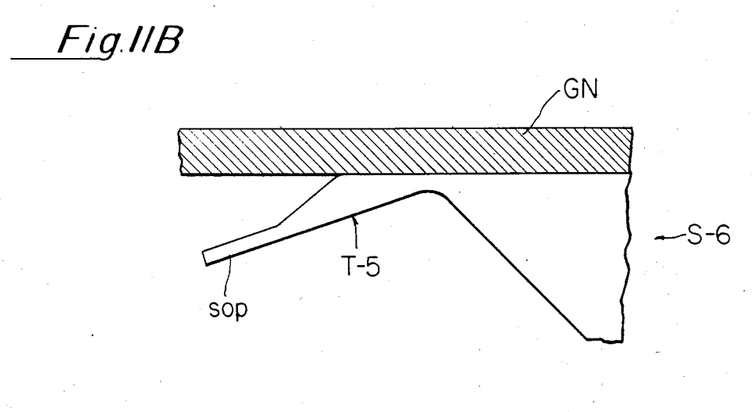

Also, according to a related feature, detents doo, doo' are preferably provided with a down-stream slope portion d-s (see plane S-S in FIG. 11A) which is relatively flat and adapted to be thrust into conforming engagement with the surface of the receiving channel base when T-5 is inserted; e.g., d-s aligns with the surface of base GN in FIG. 11B as understood by workers in the art. Of course, in this case the rigidifying brace B depicted above in FIGS. 8, 9 and 10 will be counter-productive and not called-for, as workers in the art will understand.

Conclusion

Though air seals S-2, etc. have been described exemplarily in terms of a certain kind of circuit board and card rack workers will perceive that it may readily be adapted to other uses, such as different boards and/or racks. And the handling means h thereof may evidently be adapted to other equivalent configurations.

It will be understood that the preferred embodiments described herein are only exemplary, and that the invention is capable of many modifications and variations in construction, arrangement and use without departing from the spirit of the invention.

Further modifications of the invention are also possible. For example, the means and methods disclosed herein are also applicable to other analogous air seal situations. Also the present invention is applicable for providing better seal retention and resistance to other analogous adverse influences.

The above examples of possible variations of the present invention are merely illustrative. Accordingly, the present invention is to be considered as including all possible modifications and variations coming within the scope of the invention as defined by the appended claims.

What is claimed is:

1. Air seal means adapted to replace a prescribed printed circuit board structure and be inserted into one of several identical rack slots therefor, each slot each channel means comprising a prescribed pair of spaced guide walls projected from a prescribed intermediate base means, said air seal means comprising: outer handle means dimensioned to span a said slot obstructing essentially all air flow from said slot and a pair of like planar terminal tongue structures each projected orthogonally from a respective end of said handle means and adapted to fit into a respective channel means, each said planar tonque structure including resilient base-engagement means formed via a cut out in the planar tongue structure end adapted to be resiliently compressed by it engaged base means to generate baseengagement force normal to said base means, when the air seal means is inserted into a said slot.

2. The invention of claim 1 wherein each said base-engagement means is formed by cutting a slit in said tongue structure.

3. Air seal means adapted to replace a prescribed printed circuit board structure and be inserted into one of several identical rack slots therefor, each slot being defined between a pair of spaced channel means, and being so cut as to leave a thin resilient flexure strip along a channel-engaging outer edge of the tongue structure, each channel means comprising a prescribed pair of spaced guide walls projected from a prescribed intermediate base means, said air seal means comprising: outer handle means dimensioned to span said slot and     a pair of like terminal tongue structures each cantilevered-out and projected orthogonally from a respective end of said handle means and adapted to fit into a respective channel means, each said tongue structure including resilient base-engagement means adapted to be resiliently compressed by its engaged base means to generate base-engagement force normal to said base means, when the air seal means is inserted into a said slot, said base-engagement means being formed by cutting a slit in said tongue structure; at least a portion of the so-formed flexure strip being characterized by a projecting detent means adapted to so engage its channel base means as to flex said strip and to establish said base-engagement force.

4. The invention of claim 3 wherein said tongue structures are joined and braced against bending or other distortion by a brace segment provided therebetween.

5. The invention of claim 4 as adapted for such engagement in "splayed" channel means wherein the channel guide walls diverge from one another in the direction away from the base means.

6. The invention of claim 5 wherein said pair of detent means are so projected medially along said strip and sufficient to accommodate and be resiliently engaged in slots of varying size and shape and wherein said detent means are chamfered on both sides to give "inclined-plane" engagement along a respective channel base means.

7. The invention of claim 6 wherein said guide walls are and base means are formed from sheet metal, with the guide walls being formed by prescribed bending of the sheet metal.

8. The invention of claim 3 wherein each said slot is cut to render such a strip cantilevered out in free-bar fashion along the edge of the tongue structure extending in either the insertion direction or oppositely.

9. The invention of claim 8 wherein each said slot is cut to leave a slot-gap along the base-engaging edge and so leave said strip as a flexure bar with its free end inward from the end of the tongue structure, and with said detent means disposed adjacent this free end of the strip.

10. The invention of claim 8 wherein each said slot is cut to leave a slot-gap on the distal terminal edge of the tongue structure, and so leave said strip as a flexure bar with its free end relatively coterminous with said terminal edge, and with said detent means disposed adjacent this free end of the strip.

11. The invention of claim 1 wherein each said tongue structure is made sufficiently thin and flexible as to, itself, be so resiliently compressed flexingly and generate said base-engagement force.

12. The invention of claim 11 wherein at least a portion of each said flexible tongue structure is characterized by projecting detent means, chamfered on each side and adapted to so engage its channel base means and so flexed to establish said base-engagement forces.

13. The invention of claim 17 wherein each said detent means include a flat beveled outer side portion configured to be conformed along a respective base means when the seal means is inserted into said slot and the respective tongue structure is so flexed.

14. An air seal adapted to be inserted and held in one of several prescribed slots of a card rack, each slot being defined between a pair of flat rigid opposed bases, this seal adapted to be engaged in a receiving card slot to as to thrust outward against the opposed slot base and thus establish "base-engaging" retention forces, this seal comprising planar means blocking air egress from a slot and a pair of planar engagement means, each disposed to be projected cantilever fashion at a respective end of the body means, each engagement means including at least one base-engaging flexure strip disposed along a base-engaging portion of the engagement means being formed by a cut out in said planar engagement means and arranged so that, despite dimensional variations, the flexure strips will be conjunctively thrust-away from their adjacent slot-forming bases when the seal is inserted into a slot.

15. Air seal means adapted to replace a prescribed printed circuit board structure and be inserted into one of several identical rack slots therefor, each slot being defined between a pair of spaced channel means, each channel means comprising a prescribed pair of spaced guide walls projected from a prescribed intermediate base means, said air seal means comprising: outer handle means dimensioned to span a said slot and     a pair of like terminal tongue structures, each cantilevered-out and projected orthogonally from a respective end of said handle means and adapted to fit into a respective channel means, each said tongue structure including resilient base-engagement means adapted to be resiliently compressed by its engaged base means to generate base-engagement force normal to said base maans, when the air seal means is inserted into a said slot;

each said tongue structure being made sufficiently thin and flexible as to, itself, be so resiliently compressed flexingly and generate said base-engagement force, with at least a portion of each said flexible tongue structure being characterized by projecting detent means, chamfered on each side and adapted to so engage its channel base means and so flexed to establish said base-engagement forces.

16. An air seal adapted to be inserted and held in one of several described zones of a card rack, each zone being defined between a pair of flat rigid opposed base surfaces, this seal adapted to be engaged in a pair of lower receiving card slots so as to thrust outward against the opposed slot base, and thus establish "base-engaging" retention forces, this seal comprising body means and a pair of engagement means, one disposed at either end of the body means, each engagement means including at least one base-engaging projection means cantilevered-out from the body means and characterized by a flexure strip with excursion-space inward thereof to accommodate bending of the strip when the air seal is engaged in its card slots and the flexure strip is urged against a respective base surface,     each projection means being adapted to be engagingly disposed along a respective base-surface, being arranged and constructed so that, despite dimensional and other variations, the flexure strip will be thrust-away somewhat from its adjacent slot-forming base surface when the seal is inserted into any of the zones.

17. An air seal adapted to be inserted and held in one of several prescribed slots of a card rack, each slot being defined between a pair of flat rigid opposed bases, this seal adapted to be engaged in a receiving card slot so as to thrust outward against the opposed slot base and thus establish "base-engaging" retention forces, this seal comprising body means and a pair of engagement means, one disposed at either end of the body means, each engagement means including at least one base-engaging flexure strip disposed along a base-engaging portion of the engagement means and cantilevered-out from the associated engagement means, being arranged so that, despsite dimensional and other variations, the flexure strip will be thrust-away somewhat from its adjacant slot-forming base when the seal is inserted into a slot;

each said engagement means strip being formed by cutting a slit in said tongue structure, with at least a portion of the so-formed flexure strip being characterized by a projecting detent means adapted to so engage its channel base means as to flex said strip and so etablish base-engagement force;

each slot being so cut as to leave a thin resilient flexure strip along a chaunel-engaging outer edge of the tongue structure.

18. Air seal means adapted to replace a prescribed printed circuit board structure and be inserted into one of several identical rack slots therefor, each slot being defined between a pair of spaced channel means, each channel means comprising a prescribed pair of spaced guide walls projected from a prescribed intermediate base means, said air seal means comprising: outer handle means dimensioned to span a said slot and a pair of like terminal tongue structures each projected orthogonally from a respective end of said handle means and adapted to fit relatively snugly into a respective channel means, each said tongue structure including resilient base-engagement means adapted to be resiliently compressed by its engaged base means to generate base-engagement force normal to said base means, when the air seal means is inserted into a said slot; each said base engagement means comprising a thin strip flexure of resilient material with a contact-detent on the contact face thereof and having flex-space thereunder, opposite said detetent, whereby to allow the flexure to be bent away from the base engagement means when the air seal is inserted.

19. The invention of claim 18 wherein each said flex-space is provided by a cut out in the tongue structure.

20. The invention of claim 19 wherein each said cut out is surrounded by tongue structure.

21. The invention of claim 19 wherein said tongue structures are connected, adjacent their distal free ends by relatively rigid brace means.

22. The invention of claim 19 wherein each said cut out communicates with the periphery of its tongue structure.

23. The invention of claim 22 wherein each cut out is through the engagement edge of the tongue structure, leaving a strip flexure cantilevered reentrantly back from the free distal end of the tongue structure.

24. The invention of claim 22 wherein each cut out is through the distal edge of its tongue structure, leaving the strip flexure to formed thereby projected out from the more proximal, intermediate portion of the tongue structure, with the detent discosed adjacent the distal end of this flexure projection.

25. The invention of claim 18 wherein each strip flexure constitutes a mere end strip projected from the distal end of the tongue structure.

26. The invention of claim 25 wherein the detent is disposed adjacent the distal tip of this strip flexure and is fashioned to present a final-engagement inclined surface angled to contact the mating base means in relatively congruent "line-contact".

27. The invention of claim 15 wherein each said detent means include a flat beveled outer side portion configured to be conformed along a respective base means when the seal means is inserted into said slot and the respective tongue is so flexed.

28. An air seal adapted to be so engaged in a pair of receiving card-rack slots as to thrust out against opposed slot bases and thus establish "base-engaging" retention forces, this air seal comprising a pair of like slot-engaging insert structures joined at one end by a slot-closing handle means, each insert structure including a slot-base engaging flexure strip along its outer slot-engaging surface, each said flexure strip including detent means thereon for contacting as associated slot surface so as to bias the flexure strip away therefrom, whereby despite dimensional and other variations, each flexure strip will be thrust-away somewhat from its engaged slot-surface when the seal is firmly seatei therein.

* * * * *

UNITED STATES PATENT AND TRADEMARK OFFICE
CERTIFICATE OF CORRECTION

PATENT NO. : 4,736,274
DATED : April 5, 1988
INVENTOR(S) : Michael L. Davies and Lawrence Weber It is certified that error appears in the above-identified patent and that said Letters Patent is hereby corrected as shown below:

```
In the Abstract, line 6, change "to" to --so--.
Col.  3, line 15, after "FIG. 1" insert --is a--;
         line 16, after "unit" insert --containing--;
         line 26, change "se" to --section--;
         line 37, before "stressed" insert --as--.
Col.  6, line 43, change "gaint" to --gain--.
Col.  7, line 40, change "rigidity," to --rigidity--.
Col.  8, line 52, after "slot" insert --being defined
                  between a pair of spaced channel means,--;
         line 61, change "tonque" to --tongue--.
Col.  9, line 27, change "to", second occurrence, to --so--.
Col. 10, line 12, change "to", second occurrence, to --so--;
         line 22, after "dimensional" insert --and other--.
Col. 11, line 18, change "despsite" to --despite--;
         line 27, change "etablish" to --establish--.
Col. 12, line 19, change "to" to --so--;
         line 21, change "discosed" to --disposed--;
         line 49, change "seatei" to --seated--.
```

Signed and Sealed this

Thirtieth Day of August, 1988

Attest:

DONALD J. QUIGG

Attesting Officer

Commissioner of Patents and Trademarks